(12) United States Patent
Stark et al.

(10) Patent No.: US 7,741,783 B2
(45) Date of Patent: Jun. 22, 2010

(54) MICROWAVE GENERATOR

(75) Inventors: Robert Stark, Bad Windsheim (DE); Jürgen Urban, Erlangen (DE)

(73) Assignee: Diehl BGT Defence GmbH & Co. KG, Ueberlingen (DE)

( * ) Notice: Subject to any disclaimer, the term of this patent is extended or adjusted under 35 U.S.C. 154(b) by 292 days.

(21) Appl. No.: 11/861,325

(22) Filed: Sep. 26, 2007

(65) Prior Publication Data

US 2008/0036549 A1 Feb. 14, 2008

Related U.S. Application Data

(63) Continuation of application No. PCT/EP2006/002552, filed on Mar. 21, 2006.

(30) Foreign Application Priority Data

Mar. 26, 2005 (DE) .............. 10 2005 013 925

(51) Int. Cl.
*H01J 25/50* (2006.01)
(52) U.S. Cl. .............. 315/39.51; 333/13; 333/222
(58) Field of Classification Search .......... 315/39, 315/39.51; 333/13, 20, 222; 331/127
See application file for complete search history.

(56) References Cited

U.S. PATENT DOCUMENTS 4,104,558 A 8/1978 Proud, Jr. et al.
5,549,795 A * 8/1996 Gregoire et al. .......... 204/164
6,822,394 B2 11/2004 Staines et al.
7,233,084 B2 6/2007 Dommer et al.
2007/0019414 A1* 1/2007 Staines ................... 362/296
2008/0122363 A1* 5/2008 Stark et al. ............. 315/39.51
2009/0015159 A1* 1/2009 Urban et al. ............. 313/567
2009/0079347 A1* 3/2009 Stark ....................... 315/39

FOREIGN PATENT DOCUMENTS

DE 2828409 A1 1/1980
DE 10151565 A1 5/2003
DE 10313286 B3 1/2005

OTHER PUBLICATIONS

Pokryvailo et al., "A compact Source of Subgigawatt Subnanosecond Pulses" in IEEE Transactions on Plasma Science, vol. 32, No. 5, Oct. 2004, pp. 1909-1918.

* cited by examiner

*Primary Examiner*—Haissa Philogene
(74) *Attorney, Agent, or Firm*—Laurence A. Greenberg; Werner H. Stemer; Ralph E. Locher

(57) ABSTRACT

A microwave generator has at least one resonator with two mutually opposite resonator electrodes which are separated by a spark gap. The spark gap breaks down when a high-voltage is applied. The resonator electrodes are designed in the area of the spark gap such that they result in a two-dimensional or three-dimensional section with a substantially constant, minimum electrode separation.

16 Claims, 2 Drawing Sheets

MICROWAVE GENERATOR

CROSS-REFERENCE TO RELATED APPLICATIONS

Figure 1:
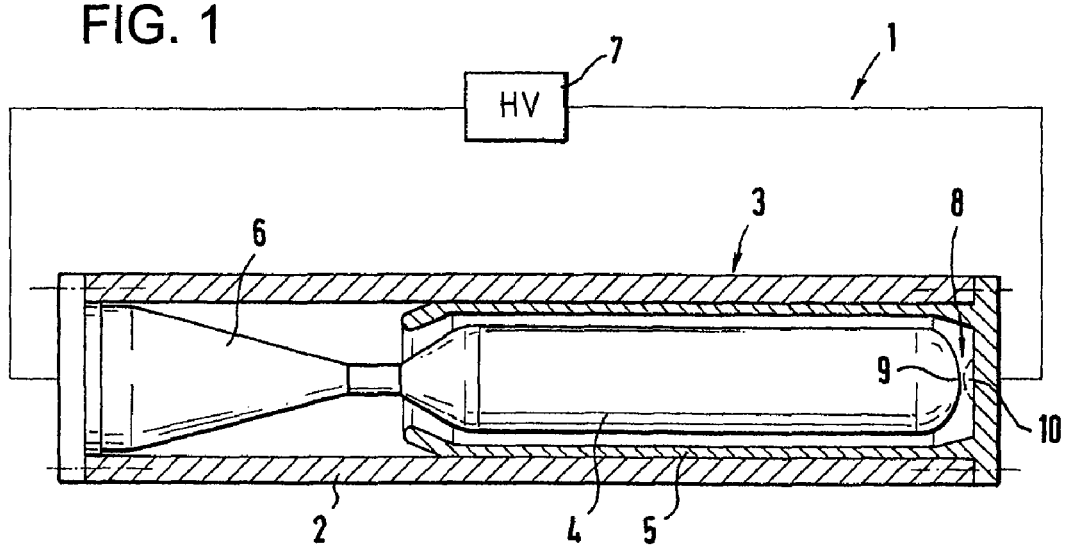

This is a continuation, under 35 U.S.C. §120, of copending international application No. PCT/EP2006/002552, filed Mar. 21, 2006, which designated the United States; this application also claims the priority, under 35 U.S.C. §119, of German patent application No. DE 10 2005 013 925.6, filed Mar. 26, 2005; the prior applications are herewith incorporated by reference in their entirety.

BACKGROUND OF THE INVENTION

Field of the Invention

The invention relates to a microwave generator, having at least one resonator comprising two mutually opposite resonator electrodes which are separated by a spark gap that breaks down when a high-voltage is applied.

The operation of a microwave generator such as this is based on the fact that a high-voltage source, for example a capacitor bank which is charged in parallel using the principle of a Marx high-voltage circuit and is then connected in series, is short-circuited across a spark gap, and is thus discharged. The short circuit results in highly oscillating discharge or short-circuit currents with a steep flank, which contain a mixture of very high frequencies which are in general emitted via an antenna as microwave energy with a broadband spectrum, which depends on the frequency mixture. This broadband microwave spectrum has an energy density which is sufficiently high that radio traffic in the vicinity of a microwave generator such as this is at least adversely affected, and the input circuits of electronic circuit can be interfered with or even destroyed by resonance effects. As an alternative to the use of a Marx high-voltage circuit, it is also possible to use a high-voltage generator driven by explosives which, in comparison with conventional high-voltage generators, can produce a single high-voltage pulse with extremely high pulse energy.

The emission of the microwave energy is based on a discharge-dependent resonance effect. The triggering electrodes between which the spark gap is formed have further associated resonant electrode or conductor structures in which the discharge current pulse that is produced on breakdown leads to powerful step-function oscillations whose frequency mixture is a resonance peak depending on the instantaneous electrically effective geometry of the resonator or resonator structure.

As stated, the microwave generator has a "damped sinusoid" resonator comprising a coaxial capacitance, which is discharged across a spark gap. In conjunction with the physical characteristics of the switch plasma which is produced when the spark gap is triggered, as well as the electrical circuitry, the capacitance forms a resonant circuit which comprises R, L and C. The capacitance is charged via a charging impedance R, L to voltages between 100 kV up to the MV range. The increasing charging voltage finally leads, as a consequence of Paschen's Law to the breakdown of the spark gap, that is to say to the closing of the plasma switch (spark gap). The spark gap can also be caused to break down deliberately by means of a suitable trigger mechanism. The physical characteristics of the spark gap (breakdown voltage, environmental pressure, electrode separation or gap separation etc.) govern the switching or trigger response of the discharge and thus the rise time and pulse current, as well as the various frequency components of the high-voltage pulse that is produced.

Resonators of the described type are typically operated in the range from a few 100 kV up to a few MV with discharge currents in the range from a few kA up to a few 10-100 kA. The pulse widths that are produced are typically in the range from a few 10 ns up to several 10 ns. The extremely high currents and voltages as well as the energy absorbed by the natural impedance of the plasma lead to considerable local erosion on the electrode surfaces of the spark gap. A conventional electrode configuration has a first electrode, which is formed on the inner resonator electrode that is rounded, for example, in the form of a cap or hemisphere in this area, as well as a second electrode on the outer resonator electrode, generally in the form of a small projection in the form of a spherical cap, with the two electrodes preferably being directly opposite one another, with a small gap of, for example, a few millimeters. Those points on the electrode surfaces which are closest to one another are subject to particularly severe corrosion. Since the present configuration of the electrodes comprises, as described, two hemispherical electrodes, and in consequence the discharge is restricted to a very tightly confined area where there is a minimum gap between the electrode surfaces, the electrode erosion is highly pronounced and, at the moment, is the element which limits the life of the resonator system. The energy coupling through the switching plasma to the electrode surface leads to local melting at hotspots on the electrode surface, with the power loss in the spark-gap switch leading to an additional increase in the electrode temperature, which further increases the erosion rate. The severe erosion of the electrodes necessarily leads to an increase in the spark gap size and thus to a change in the breakdown characteristic, and this at the same time results in an increase in the pulse rise time and thus in a change to the emitted frequency spectrum. Because of the erosion that occurs, it is not possible to achieve constant behaviour over a lengthy time.

BRIEF SUMMARY OF THE INVENTION

It is accordingly an object of the invention to provide a microwave generator, which overcomes the above-mentioned disadvantages of the heretofore-known devices and methods of this general type and which provides for a microwave generator in which the erosion rate on the spark gap electrodes is reduced, and which allows stable and reliable operation.

With the foregoing and other objects in view there is provided, in accordance with the invention, a microwave generator, comprising:

at least one resonator having two mutually opposite resonator electrodes disposed to define a spark gap therebetween separating said resonator electrodes and subject to breaking down when a high voltage is applied;

the resonator electrodes being configured, in a region of the spark gap, to form a two-dimensional or three-dimensional section with a substantially constant, minimum electrode separation.

In accordance with a preferred embodiment of the invention, at least one of the resonator electrodes is formed with a projecting annular structure, i.e., a ring structure.

In other words, the objects of the invention are achieved in that the resonator electrodes are designed in the area of the spark gap such that they result in a two-dimensional or three-dimensional section with an essentially constant, minimum electrode separation.

In the microwave generator according to the invention, the electrode surface which is available for the discharge is considerably larger than that of the previously known geometry, in which, in the end, the hemispherical electrode shape resulted in only one point of minimum electrode separation. According to the invention, a two-dimensional or three-dimensional section is provided having an essentially constant electrode separation, but which is minimum with respect to the overall electrode separation, across which the spark gap is formed. Once the discharge has been struck, depending on the environmental gas pressure, in a statistically distributed form on the surfaces of the electrodes with the shortest electrode separation, the electrode configuration according to the invention results in a considerably larger electrode area being available, across which the triggering can take place. Even if erosion occurs as a consequence of a triggering process in the area in which the triggering has taken place, as a consequence of which the original geometric preconditions are not satisfied in this area, the larger electrode sections between which the minimum electrode separation is provided still provide adequate further triggering capabilities with an optimized electrode geometry. The life of the electrode configuration, and therefore the life and reliability of the triggering spark gap, are considerably increased by the statistical distribution of the discharge over a larger electrode area. In consequence, erosion effects are now barely significant, and the constant conditions, seen even over a lengthy operating time, within the spark gap result in there being no changes in the breakdown characteristic and, resulting from this, in the overall generator operation.

According to a first refinement to the invention, at least one resonator electrode has a projecting ring structure, in which case a plurality of centrally symmetrical ring structures of different radii, that is to say located one inside the other, can be provided, with each of these being located at the same distance from the opposite resonator electrode, that is to say such that triggering can take place both via one and via the other ring structure to the opposite electrode.

While one or more ring structures can be provided only on one resonator electrode, for example on the outer electrode, and the opposite inner resonator electrode in the area of the ring structure or structures is, for example, flat in order to maintain a constant minimum electrode separation, it is alternatively feasible to provide at least one or possibly a plurality of centrally symmetrical ring structures on both resonator electrodes. In this case, the respective ring structures may have the same radius and be directly opposite one another, that is to say the spark gap would be provided across the mutually directly opposite end surfaces of the ring structures. Alternatively, it is also feasible for the ring structures to have different radii and to engage in one another such that the spark gap would extend primarily over the side surfaces of the ring structures.

As an alternative to the use of projecting ring structures on both resonator electrodes it is also feasible to provide a ring structure such as this on only one resonator electrode, and to form an annular depression on the other, in which the ring structure engages. If the geometry of the ring structure as well as that of the depression is chosen such that both are at a constant minimum distance from one another over the entire engagement depth, this makes it possible to provide a very large triggering area.

In this case, in general, the ring structure—and possibly also the annular depression—can taper towards the free end, and towards the depression base, respectively.

As an alternative to the use of one or more ring structures, it is also possible to provide a pin-like or stamp-like projecting structure on one resonator electrode, which engages in a recess on the opposite resonator electrode. The structure is expediently rotationally symmetrical, and the recess hollow-cylindrical. In the case of a structure which is in the form of a pin, the structure and the recess should taper towards its free end or towards the recess base, respectively, thus making it possible to avoid undesirable field peaks which would lead to undesirable localization of the discharge, and thus to increased erosion. The structure which is preferably in the form of a pin and the recess are preferably rounded at their free end and in the recess base, respectively.

By way of example, a stamp-like structure may be cylindrical, with the recess in this case being hollow-cylindrical, with the spark gap in this case preferably being provided over the entire envelope surface of the stamp-like structure and the inner surface of the hollow-cylindrical recess. As an alternative, it is also feasible for the stamp-like structure to be essentially T-shaped, with the attachment of the structure which has the greatest radius being closest to the hollow-cylindrical recess, and the spark gap being produced in this area.

One alternative to the use of a recess, which is introduced into a resonator electrode which is closed overall and is preferably composed of solid material, provides for a circular recess, that is to say an aperture, to be provided in a hollow resonator electrode, in which the cylindrical pin-like structure engages or through which this structure passes. In this case, the spark gap is formed between the boundary of the circular recess and the opposite side surface of the pin-like structure. The electrode edge which bounds the recess may in this case have a rounded cross section.

Other features which are considered as characteristic for the invention are set forth in the appended claims.

Although the invention is illustrated and described herein as embodied in microwave generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTIONS OF THE SEVERAL VIEWS OF THE DRAWING

Figure 2:
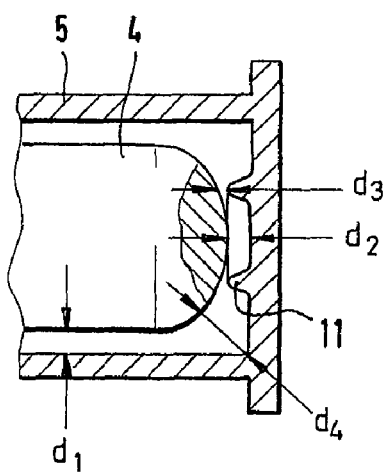
Figure 3:
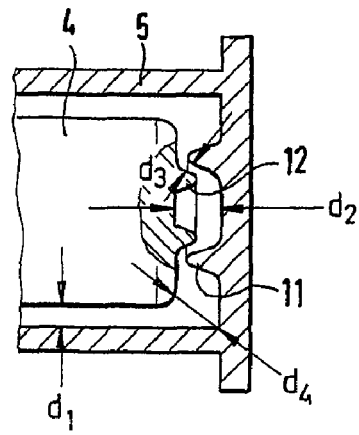
Figure 4:
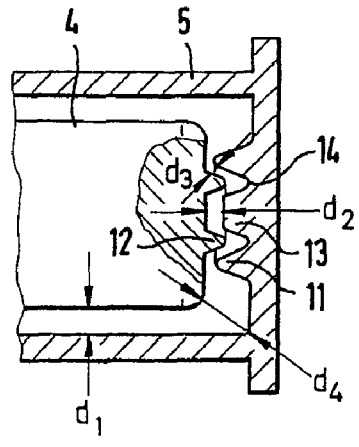
Figure 5:
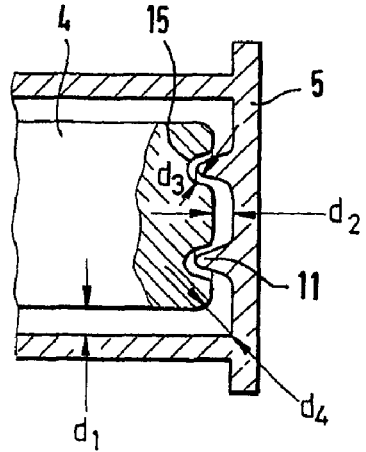
Figure 6:
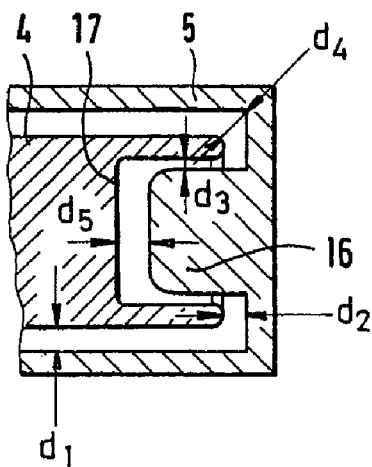
Figure 7:
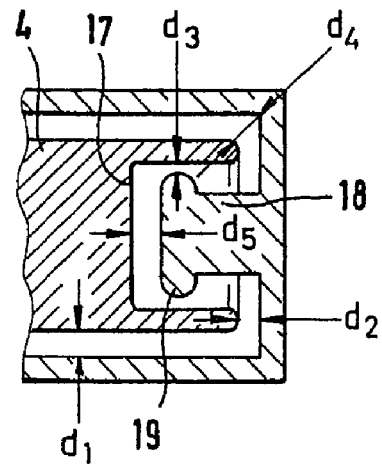
Figure 8:
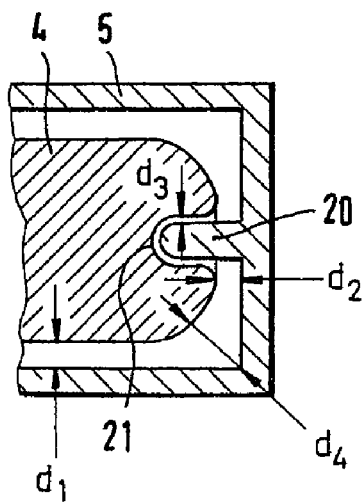
Figure 9:
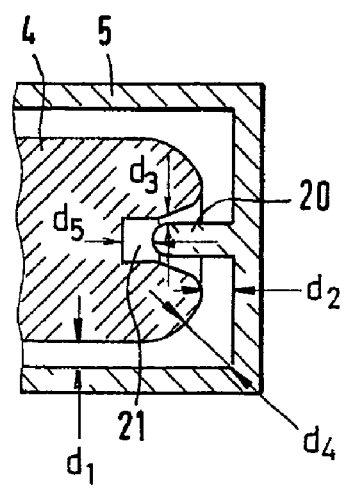
Figure 10:
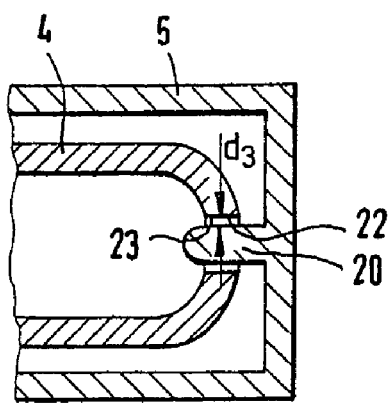
Figure 11:
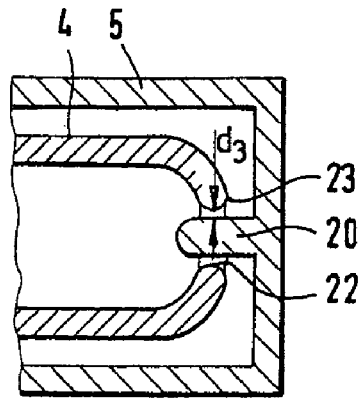

FIG. 1 shows an outline illustration of a The microwave generator according to the invention, FIG. 2 shows a partial view of the electrode configuration in the area of the spark gap in a first embodiment, FIG. 3 shows an embodiment of the electrodes in the area of the spark gap according to a second embodiment, FIG. 4 shows a configuration of the electrodes in the area of the spark gap according to a third embodiment, FIG. 5 shows a configuration of the electrodes in the area of the spark gap according to a fourth embodiment, FIG. 6 shows a configuration of the electrodes in the area of the spark gap according to a fifth embodiment, FIG. 7 shows a configuration of the electrodes in the area of the spark gap according to a sixth embodiment, FIG. 8 shows a configuration of the electrodes in the area of the spark gap according to a seventh embodiment, FIG. 9 shows a configuration of the electrodes in the area of the spark gap according to an eighth embodiment, FIG. 10 shows a configuration of the electrodes in the area of the spark gap according to a ninth embodiment, and FIG. 11 shows a configuration of the electrodes in the area of the spark gap according to a tenth embodiment.

DETAILED DESCRIPTION OF THE INVENTION

Referring now to the figures of the drawing in detail and first, particularly, to FIG. 1 thereof, a microwave generator 1 according to the invention comprises a housing 2 composed of fibreglass or the like, in which a resonator 3 is provided. The resonator 3 comprises an inner resonator electrode 4, in the form of a lobe and an outer resonator electrode 5, which is in the form of a pot and clasps the inner resonator electrode 4, at a radial distance from it. The inner resonator electrode 4 tapers towards its left-hand end and is connected to a conical emission element 6, via which the microwaves that are produced are emitted. A high-voltage source 7 is also provided, for example a Marx high-voltage generator, by means of which the high-voltage is applied to the coaxial resonator 3.

The two resonator electrodes 4, 5 are separated from one another by a spark gap 8, with the spark gap being isolated by a gaseous dielectric, preferably $SF_6/N_2$ gas, located in the interior of the housing 2. The spark gap is formed between two spark-gap electrode sections 9, 10, with the spark-gap electrode section 9 being an integral part of the inner resonator electrode 4 and being provided at its right-hand end in FIG. 1, while the spark-gap electrode section 10 is an integral part of the outer resonator electrode 5, which is in the form of a pot.

In order now to emit microwaves, the necessary high voltage is applied by means of the high-voltage source 7, such that the given coaxial capacitance of the resonator 3 is charged. When the breakdown voltage of the spark gap 8 is reached, then this is triggered in the area in which the two spark-gap electrode sections 9, 10 are at a minimum distance from one another. The short circuit results in highly oscillating discharge or short-circuit currents, and appropriate matching of the impedance relationships in the resonator results in a damped sinusoidal oscillation and the emission of microwaves via the emission element 6.

The geometry of the resonator electrodes 4, 5 in the area of the spark gap 8 may be chosen differently in order to avoid erosion-dependent disadvantages.

FIG. 2 shows a first embodiment. The inner resonator electrode 4 which, for example, is in the form of a solid-material component, is rounded in a hemispherical shape at its free end. The outer resonator electrode 5 has an annular structure or ring structure 11 which projects towards the inner resonator electrode 4. The ring structure 11 tapers towards its free end. The spark gap is formed between the free end edge of the ring structure 11 and the opposite electrode surface, once the two electrodes 4, 5 have assumed the minimum distance from one another in this area, with this distance, however, being constant over the entire length of the ring structure. This results in a two-dimensional section here with a constant electrode separation, after which the ring structure 11 tapers, and is rounded at its free end.

FIG. 2 shows the distances between the electrodes. $d_1$ denotes the radial distance between the resonator electrodes 4, 5. $d_2$ denotes the electrode separation between the base of the resonator electrode 5 and the electrode surface of the resonator electrode 4. $d_3$ denotes the minimum electrode separation between the end edge of the ring structure 11 and the opposite electrode surface, while $d_4$ describes the electrode separation towards the side.

In general $d_1$, $d_2$, $d_3$ and $d_4$ are freely variable, although, dependent on the embodiment, they may also be the same. However, they are invariably greater than $d_3$ that is to say $d_1$, $d_2$, $d_4 > d_3$. The electrode separation $d_3$ can, however, always be chosen taking account of Paschen's Law FIG. 3 shows a further embodiment of the resonator electrodes 4, 5, once again showing the corresponding separations. This embodiment of the resonator electrode 5 corresponds essentially to that in FIG. 2, with a ring structure 11 being provided in this case as well, although this structure extends somewhat further into the electrode interior. A second ring structure 12 is provided on the resonator electrode 4 and projects in the opposite direction, and its radius is less than that of the ring structure 11. As can be seen from FIG. 3, the two ring structures 11, 12 engage in one another. The minimum separation $d_3$ in this case occurs in the area of the outer or side surfaces of the ring structures 11, 12, while these are opposite one another. In this case as well, $d_1$, $d_2$, $d_4 > d_3$. Depending on the embodiment of the ring structures 11, 12, there is once again a two-dimensional section with a minimum electrode separation in this case as well, that is to say in the end a circular ring with a minimum separation. However, if the ring structures 11, 12 are made flat in the area of their side surfaces, it is feasible to produce a three-dimensional, large-area section with the same separation.

FIG. 4 shows a further embodiment of the resonator electrodes 4, 5, with the ring structures 11, 12 that are known from FIG. 3 also being provided on both resonator electrodes 4, 5 here, but with a central projection 13 being provided on the resonator electrode 5 so that, in the end, this results in an annular depression 14 between the ring structure 11 and the projection 13, in which part of the ring structure 12 engages. In this case as well, the distances are once again shown, in which case, in principle once again, $d_1$, $d_2$, $d_4 > d_3$. At this point, it should be noted that the minimum electrode separation $d_3$ cannot be provided or cannot just be provided between the two ring structures 11, 12, and in fact it can also be provided between the central projection 13 and the ring structure 12, depending on the geometric configuration.

FIG. 5 shows a further electrode configuration. The resonator electrode 5 has a ring structure 11, while a depression 15 is provided on the resonator electrode 4 and in the illustrated example, it corresponds essentially to the tapering shape of the ring structure 11. The free end of the ring structure 11 partially engages in the depression 15. If the geometric relationships are such that the distance between the ring structure 11 and the electrode surface which bounds the depression 15 is constant over the entire area of engagement, a very large electrode area with minimum separation can be provided here. In this case as well, the corresponding separation relationships are shown, once again with $d_1$, $d_2$, $d_4 > d_3$.

FIG. 6 shows an alternative electrode configuration in comparison to the previously described ring structures. A cylindrical stamp-like structure 16 with a constant diameter is provided on the outer electrode 5 and is rounded at the edge only in the area of its free end. This stamp-like structure engages in a hollow-cylindrical recess 17 in the resonator electrode 4, which likewise has a constant internal diameter. The minimum electrode separation $d_3$ is in this case provided over a large area. In this case as well, the separation relationships are once again shown, with the separation $d_5$ additionally being shown in this case, indicating the distance between the free end surface of the structure 16 and the opposite base surface of the hollow-cylindrical recess 17. In this case as well, $d_1$, $d_2$, $d_4$ and $d_5$ can be chosen freely and in the extreme even to be the same, although it is always necessary to ensure that $d_1$, $d_2$, $d_4$, $d_5 > d_3$.

Finally, FIG. 7 shows a further embodiment with a stamp-like structure 18 which has an essentially T-shaped cross section and an upper attachment 19 with a larger diameter. In this case as well, the structure 18 engages in a hollow-cylindrical recess 17 in the resonator electrode 4. The rim edge of the attachment 19 is rounded or tapers, such that the curvature results in a point on the curved surface at which the minimum separation $d_3$ is produced. Once again, a quasi-two-dimensional ring section with a minimum electrode separation would also be produced in this case. A larger area with the same separation can be achieved with a planar configuration of the edge of the attachment 19.

FIG. 8 shows a further embodiment of an electrode configuration. A pin-like structure 20 is provided on the resonator electrode 5 and engages in a corresponding recess 21 in the solid resonator electrode 4. The pin-like structure 20 tapers slightly in a hemispherical shape, with the shape of the recess 21 being chosen appropriately such that the minimum electrode separation $d_3$ can be achieved over the entire engagement depth. In this case as well, as normal, the separations are shown, once again, in this case, in general $d_1, d_2, d_4 > d_3$.

A further alternative electrode configuration is shown in FIG. 9. In this case as well, a pin-like structure 20 and an opposite recess 21 are provided, although their shapes are not matched to one another. Depending on how the two electrodes are configured in the engagement area between the pin-like structure 20 and the recess 21, this results in a more or less large area with a constant minimum electrode separation.

FIG. 10 shows a further electrode configuration. The resonator electrode 4 is in this case a hollow electrode and has a round circular recess 22, that is to say an aperture, through which the pin-like structure 20, which is rounded at the one end, passes. The inner edge surface 23 which bounds the recess 22 is in this case essentially flat, thus resulting in a large-area section with a constant electrode separation, across which triggering can take place.

FIG. 11 shows a similar embodiment, but in this case with the boundary surface 23 being rounded such that this results in only a circumferential two-dimensional circular ring with a constant electrode separation.

The exemplary embodiments that have been described are not restrictive. The fundamental principle of the present invention is that the respective electrode configuration is chosen such that it results not only in a one-dimensional point with a minimum electrode separation, across which the spark gap is triggered, but a two-dimensional or three-dimensional section with a constant electrode separation, across which triggering can take place. If erosion effects occur here, there are still sufficient further section areas with a minimum and thus optimum electrode separation available, across which subsequent triggering processes can take place.

The invention claimed is:

1. A microwave generator, comprising:
at least one resonator having two mutually opposite resonator electrodes disposed to define a spark gap therebetween separating said resonator electrodes and subject to breaking down when a high voltage is applied;
said resonator electrodes being configured, in a region of said spark gap, to form a two-dimensional or three-dimensional section with a substantially constant, minimum electrode separation;
at least one of said resonator electrodes being formed with a projecting ring structure;
each of said resonator electrodes being formed with at least one ring structure; and
respective said ring structures having different radii and one engages in the other.

2. A microwave generator, comprising:
at least one resonator having two mutually opposite resonator electrodes disposed to define a spark gap therebetween separating said resonator electrodes and subject to breaking down when a high voltage is applied;
said resonator electrodes being configured, in a region of said spark gap, to form a two-dimensional or three-dimensional section with a substantially constant, minimum electrode separation;
at least one of said resonator electrodes being formed with a projecting ring structure; and
a cross section of said ring structure tapering towards a free end thereof.

3. The microwave generator according to claim 2, wherein said projecting ring structure is one of a plurality of centrally-symmetrical ring structures.

4. The microwave generator according to claim 2, wherein each of said resonator electrodes is formed with at least one ring structure.

5. The microwave generator according to claim 4, wherein respective said ring structures have a common radius and are disposed opposite one another.

6. A microwave generator, comprising:
at least one resonator having two mutually opposite resonator electrodes disposed to define a spark gap therebetween separating said resonator electrodes and subject to breaking down when a high voltage is applied;
said resonator electrodes being configured, in a region of said spark gap, to form a two-dimensional or three-dimensional section with a substantially constant, minimum electrode separation;
at least one of said resonator electrodes being formed with a projecting ring structure; and
a respective said resonator electrode opposite said resonator electrode formed with said ring structure being formed with an annular depression in which said ring structure engages.

7. The microwave generator according to claim 6, wherein said structure is rotationally symmetrical, and said recess is hollow-cylindrical.

8. The microwave generator according to claim 6, wherein a cross section of said ring structure tapers towards a free end thereof, and a cross section of said annular depression tapers towards a depression base.

9. A microwave generator, comprising:
at least one resonator having two mutually opposite resonator electrodes disposed to define a spark gap therebetween separating said resonator electrodes and subject to breaking down when a high voltage is applied;
said resonator electrodes being configured, in a region of said spark gap, to form a two-dimensional or three-dimensional section with a substantially constant, minimum electrode separation; and
one of said resonator electrodes being formed with a projecting structure in the form of a pin or stamp engaging in a recess formed on an opposite said resonator electrode.

10. The microwave generator according to claim 9, wherein said cylindrical structure is a pin passing through a circular recess in an opposite hollow resonator electrode.

11. The microwave generator according to claim 10, wherein said hollow resonator electrode is formed with an electrode edge bounding said circular recess with a rounded cross section.

12. The microwave generator according to claim 9, wherein one pin-shaped structure and said recess taper towards a free end and a recess base, thereof, respectively.

13. The microwave generator according to claim 9, wherein said pin-shaped structure has a rounded free end, and said recess has a rounded recess base.

14. The microwave generator according to claim 9, wherein said stamp is cylindrical.

15. The microwave generator according to claim 9, wherein said stamp has a T-shaped cross section.

16. The microwave generator according to claim 9, wherein at least one of said resonator electrodes is formed with a projecting ring structure.

* * * * *